(12) United States Patent
Sharif et al.

(10) Patent No.: US 10,116,318 B1
(45) Date of Patent: Oct. 30, 2018

(54) METHOD AND SYSTEM FOR ASYNCHRONOUS CLOCK GENERATION FOR SUCCESSIVE APPROXIMATION ANALOG-TO-DIGITAL CONVERTER (SAR ADC)

(71) Applicant: Infinera Corporation, Sunnyvale, CA (US)

(72) Inventors: Shah Sharif, San Jose, CA (US); Fu-Tai An, San Jose, CA (US)

(73) Assignee: Infinera Corporation, Sunnyvale, CA (US)

(*) Notice: Subject to any disclaimer, the term of this patent is extended or adjusted under 35 U.S.C. 154(b) by 0 days.

(21) Appl. No.: 15/695,935

(22) Filed: Sep. 5, 2017

(51) Int. Cl.
  H03M 1/38 (2006.01)
  H03M 1/12 (2006.01)
  H03M 1/46 (2006.01)

(52) U.S. Cl.
  CPC .......... *H03M 1/125* (2013.01); *H03M 1/462* (2013.01)

(58) Field of Classification Search
  CPC ......... H03M 1/125; H03M 1/462; H03M 1/38
  USPC .................. 341/155, 161, 162, 172, 118
  See application file for complete search history.

(56) References Cited

U.S. PATENT DOCUMENTS

| | | | | |
|---|---|---|---|---|
| 7,212,143 B1* | 5/2007 | Confalonieri | ....... | H03M 1/1225 341/141 |
| 8,957,802 B1* | 2/2015 | Evans | ................. | H03M 1/0863 341/155 |
| 9,584,144 B1* | 2/2017 | Zhou | .................. | H03K 5/15026 |
| 9,614,539 B2* | 4/2017 | Tang | ...................... | H03M 1/466 |
| 9,621,179 B1* | 4/2017 | Maulik | ................. | H03M 1/466 |
| 9,685,973 B2* | 6/2017 | Liu | ...................... | H03M 1/1245 |
| 2011/0057823 A1* | 3/2011 | Harpe | .................. | H03M 1/125 341/133 |
| 2012/0032824 A1* | 2/2012 | Yoshioka | ............. | H03L 7/0812 341/110 |
| 2014/0022105 A1* | 1/2014 | Chen | ....................... | H03M 1/38 341/161 |
| 2014/0184436 A1* | 7/2014 | Lee | ......................... | H03M 1/38 341/161 |
| 2014/0210653 A1* | 7/2014 | Harpe | ................. | H03M 1/0697 341/110 |
| 2015/0061904 A1* | 3/2015 | Lee | ..................... | H03M 1/1023 341/118 |
| 2015/0263765 A1* | 9/2015 | Zhang | ................ | H03M 13/275 714/762 |

* cited by examiner

*Primary Examiner* — Linh Nguyen
(74) *Attorney, Agent, or Firm* — David L. Soltz

(57) ABSTRACT

A method and apparatus are disclosed for asynchronous clock generation in analog-to-digital converters (ADCs). For example, an ADC may comprise a comparator, a first logic gate, a second logic gate, a first memory element, a second memory element, and a digital-to-analog converter (DAC). The comparator may initiate an evaluation or precharge operation of comparator inputs. The first logic gate may generate, based on comparator outputs, a first output signal indicating validity of first logic gate output. The second logic gate may generate a second output signal indicating timing reference of bit conversion. The first memory element may generate a third output signal indicating a current state of a bit. The second memory element may generate a plurality of next state bits based on the second output signal and the comparator outputs. The second logic gate may generate the second output signal based on the first and third output signals.

16 Claims, 4 Drawing Sheets

# METHOD AND SYSTEM FOR ASYNCHRONOUS CLOCK GENERATION FOR SUCCESSIVE APPROXIMATION ANALOG-TO-DIGITAL CONVERTER (SAR ADC)

FIELD OF INVENTION

The disclosed embodiments are generally directed to analog-to-digital converters (ADCs) and more specifically, to asynchronous clock generation for successive approximation analog-to-digital converters (SAR ADCs).

BACKGROUND

An analog-to-digital converter (ADC) is a system that converts an analog input signal into a digital output signal. One way to achieve such analog to digital conversion is by using a successive approximation analog-to-digital converter (SAR ADC). A SAR ADC performs successive comparison of input voltage signals to generated analog signals at each conversion cycle. The result of each comparison is used to generate the final outputs of digital signal, which is the digital representation of the analog input voltage signal. In a SAR ADC (including synchronous and asynchronous), a slicer (also known as quantizer or comparator) determines the polarity of input voltage signals and a capacitive digital-to-analog converter (CDAC) produces submultiple of reference voltages in consecutive cycles. The reference voltages provided by the CDAC may be added or subtracted from the input voltage where the SAR ADC may choose to perform top plate sampling.

In high speed and low power application, asynchronous signal processing is advantageous over synchronous signal processing because it is simple and faster. However, current asynchronous signal processing in conventional SAR ADCs is inefficient for ultra-high speed application because there exist critical path delays such as processing time of multiple memory elements (e.g. flip flops). Thus, it would be desirable to have a method and apparatus that provides ultra-high speed asynchronous signal processing by reducing the critical path delays.

SUMMARY

A method and apparatus are disclosed herein for asynchronous clock generation in analog-to-digital converters (ADCs). For example, an ADC may comprise a comparator, a first logic gate, a second logic gate, a first memory element, a second memory element, and a digital-to-analog converter (DAC). The comparator may initiate an evaluation operation or a precharge operation of one or more comparator inputs based on the state of an asynchronous comparator clock signal. The first logic gate, operatively coupled to the comparator, may generate, based on outputs of the comparator, a first output signal that indicates validity of output of the first logic gate. The first output signal may become high (logic 1) after processing delays at the comparator and the first logic gate during the evaluation operation. The first output signal may become low (logic 0) after processing delays at the comparator and the first logic gate during the precharge operation. The second logic gate, operatively coupled to the first logic gate, may generate a second output signal that indicates timing reference of bit conversion. The first memory element, operatively coupled to the second logic gate, may generate a third output signal that indicates current state of a bit that is input for the second logic gate. The third output signal may be generated based on an inverse signal of the asynchronous comparator clock signal. The third output signal may be generated earlier than the first output signal. The second logic gate may generate the second output signal based on the first output signal and the third output signal. The second memory element, operatively coupled to the second logic gate, may generate a plurality of next state bits. Each of the plurality of next state bits may be determined based on the second output signal and the outputs of the comparator.

BRIEF DESCRIPTION OF THE DRAWINGS

A more detailed understanding may be had from the following description, given by way of example in conjunction with the accompanying drawings wherein.

DETAILED DESCRIPTION

In an asynchronous successive approximation analog-to-digital converter (SAR ADC), the transitions of comparator output may trigger an internal timing reference signal during each bit conversion. This way, the comparator output may be used as a valid indicator for current state bits. In turn, the current state bits may be used to acquire the comparator output by a memory element, thereby generating next state bits. Ultra-high speed asynchronous signal processing may be achieved by limiting critical path delays for acquiring the comparator output and generating the next state bits to the least number of memory elements with minor logic gate delay. In addition, the current state bits may be generated by the comparator-enable signal (e.g., asynchronous comparator clock signal) outside the internal timing reference signal.

Figure 1:
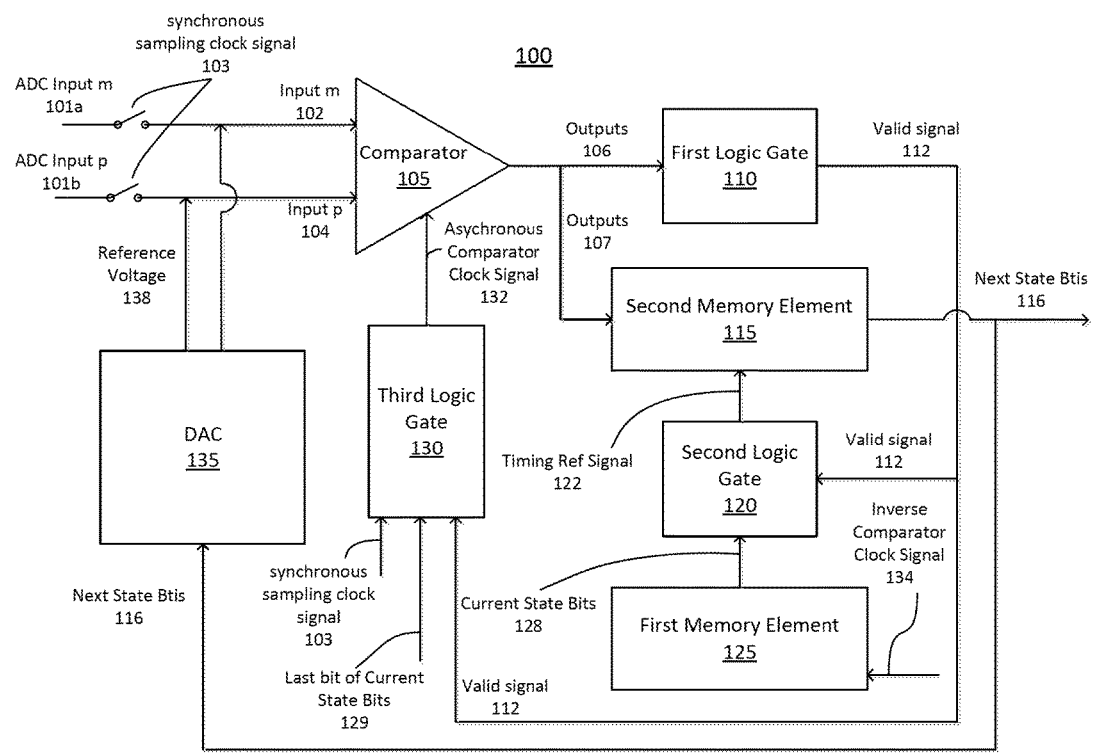
FIG. 1 is a block diagram illustrating an example successive approximation analog-to-digital converter (SAR ADC) for asynchronous clock generation.

FIG. 1 is a block diagram illustrating an example SAR ADC 100 for asynchronous clock generation. The SAR ADC 100 may comprise a comparator 105, a first logic gate 110, a second logic gate 120, a third logic gate 130, a first memory element 125, a second memory element 115, and a digital-to-analog converter (DAC) 135.

A comparator 105 is a device that compares two analog input voltages or currents and produces a digital signal indicating which one of the analog input voltages is larger. For example, the SAR ADC 100 may receive two analog input voltages, ADC input m 101a and ADC input p 101b and sample those input into input m 102 and input p 104. The comparator 105, then, may process the sampled input m 102 and sampled input p 104 and generate binary digital outputs 106, 107. The input m 102 and input p 104 may be initialized to a high state such as 1.0 volts. The comparator 105 may initiate evaluation operation of ADC input m 101a and ADC input p 101b when an asynchronous comparator clock signal 132 becomes low (i.e. logic 0). This means that after the asynchronous comparator clock signal 132 became low, the comparator 105 may decide which analog input voltage is larger among the input m 102 (i.e. sampled input m) and the input p 104 (i.e. sample input p). After determining the larger input, the comparator 105 may produce one or more outputs 106, 107 such as an output m and output p. The output p and output m may be a binary logic signal indicating logic 0 and logic 1. If the input m 102 is larger than the input p 104, the output m may be logic 1 and the output p may be logic 0. In another example, if the input p 104 is larger than the input m 102, the output p may be logic 1 and the output m may be logic 0. Thus, after the evaluation operation, different output 106 may enter into the first logic gate 110 for further processing.

The comparator 105 may also perform a precharge operation when an asynchronous comparator clock signal 132 becomes high (i.e. logic 1). This means that the comparator 105 does not evaluate which one of analog input voltages is larger among the input m 102 and input p 104 when the asynchronous comparator clock signal 132 is high (i.e. logic 1). Accordingly, the comparator may produce the same logic level of outputs 106, 107. For example, both output m and output p may be high (i.e. logic 1) after the comparator 105. Thus, the same logic level of outputs 106, 107 may be entered into the first logic gate 110 and the second memory element 115 for further processing.

The first logic gate 110 is a physical device implementing a Boolean function. For example, the first logic gate 110 may perform a logical operation on one or more comparator output 106 and produce a single binary output. This single binary output may be referred to as a valid signal 112. The first logic gate 110 may be primarily implemented using diodes or transistors acting as electronic switches, but can also be constructed using vacuum tubes, electromagnetic relays (relay logic), fluidic logic, pneumatic logic, optics, molecules, or even mechanical elements. The first logic gate 110 may be any type of circuits configured to perform a logical function. Examples of the first logic gate 110 may include a NOT gate, an AND gate, an OR gate, a XOR gate, a NAND gate, a NOR gate, a XNOR gate, and the like.

As described above, the comparator 105 may initiate evaluation operation of input m 102 and input p 104 when an asynchronous comparator clock signal 132 becomes low (i.e. logic 0). Once the comparator 105 produces outputs 106, 107 of the comparator 105, the first logic gate 110 may perform a logical operation on the outputs 106 to generate a valid signal 112. For example, assuming that the first logic gate 110 is a NAND gate, the first logic gate 110 performs a NAND operation on output m and output p. If the output m and output p are different (e.g., output m is logic 1 and output p is logic 0), the first logic gate 110 may generate an output of logic 1 as the valid signal 112. However, during the precharge operation, the comparator 105 may generate the same outputs (e.g., output m is logic 1 and output p is logic 1). Thus, the first logic gate 110 (e.g. NAND gate) may generate an output of logic 0 as the valid signal 112. In other words, during the evaluation operation, the valid signal 112 may become high (i.e. logic 1) after processing delays at the comparator 105 and the first logic gate 110. However, during the precharge operation, the valid signal 112 may become low (i.e. logic 0) after processing delays at the comparator 105 and the first logic gate 110.

The first memory element 125 may comprise multiple flip flops to generate multiple current state bits 128. A flip flop is a circuit that has two stable states and can be used to store state information. The circuit can be made to change state by signals applied to one or more control inputs and will have one or two outputs. It is the basic storage element in sequential logic. The flip flops can be clocked (synchronous or edge-triggered). This means that a flip-flop is edge-sensitive and a flip flop's output only changes on a single type (positive going or negative going) of clock edge. Each of the flip flops in the first memory element 125 may be any type of flip flops. Examples of the flip flop may include simple set-reset latches, gated latches, D flip flop, T flip flop, JK flip flop, and the like.

The number of flip flops in the first memory element 125 may depend on the number of Analog-to-Digital converter bits that the SAR ADC 100 can perform. For example, if the SAR ADC 100 is an 8-bit ADC, the first memory element 125 may include 8 flip flops. If the SAR ADC 100 is a 16-bit ADC, the first memory element 124 may have 16 flip flops. In an embodiment, one or more additional flip flops may be added to the first memory element 125 to generate the most significant or least significant bit of the current state bits 128. Specifically, if the SAR ADC 100 is an 8-bit ADC, the first memory element 125 may include 8+1 flip flops to generate the current state bits 128.

The first memory element 125 may be initialized by a synchronous sampling clock signal 103 (or synchronous sampling reference signal). Assuming that the SAR ADC 100 is an 8-bit ADC with 9 flip flops (flip flop 0 to flip flop 8) in the first memory element 125, the flip flop 0 may be set by the synchronous sampling clock signal 103 and the flip flops 1 to 8 may be reset by the synchronous sampling clock signal 103. Specifically, output of the flip flop 0 is initialized to a high state (i.e. logic 1) and outputs of the flip flops 1 to 8 are initialized to a low state (i.e. logic 0). The synchronous sampling clock signal 103 may be initialized to a high state (i.e. logic 1) when the switches are connected. The synchronous sampling clock signal 103 may change from high (i.e. logic 1) to low (i.e. logic 0) when the switches are disconnected.

As described above, the first memory element 125 may generate current state bits 128 after the comparator 105 initiates evaluation operation of input m 102 and input p 104. This means that the flip flops 1-8 may generate, based on an inverse comparator clock signal 134, the current state bits 128 after an asynchronous comparator clock signal 132 changes from high to low. The inverse comparator clock signal 134 may be an inverse signal of the asynchronous comparator clock signal 132. Thus, when the asynchronous comparator clock signal 132 changes from high to low, the inverse comparator clock signal 134 may change from low to high. Accordingly, at the rising edge of the inverse comparator clock signal 134, the flip flop 1 may capture the value of input (e.g., D=1). The captured value may become the output of flip flop 1 (e.g., Q=1), which is the first current state bit 128. At each conversion cycle, the flip flops 2-8 generate the rest of current state bits 128 in a sequential order as described above. It should be noted that each of the current state bits 128 may be generated earlier than the valid signal 112 at each conversion cycle. It is because the inverse comparator clock signal 134 may be generated right after the asynchronous comparator clock signal 132 falls (i.e. from high to low). However, the valid signal 112 may be generated after processing delays at the comparator 105 and the first logic gate 110. Thus, generating the current state bits 128 is faster than generating the valid signal 112.

Similar to the first logic gate 110, a second logic gate 120 is a physical device implementing a Boolean function. For example, the second logic gate 120 may perform a logical operation on current state bits 128 and a valid signal 112, thereby producing a single binary output. This single binary output may be referred to as a timing reference signal 122. Similar to the first logic gate 110, the second logic gate 120 may be primarily implemented using diodes or transistors acting as electronic switches, but can also be constructed using vacuum tubes, electromagnetic relays (relay logic), fluidic logic, pneumatic logic, optics, molecules, or even mechanical elements. The second logic gate 110 may also be any type of circuits configured to perform a logical function. Examples of the second logic gate 120 may include a NOT gate, an AND gate, an OR gate, a XOR gate, a NAND gate, a NOR gate, a XNOR gate, and the like.

Assuming that the second logic gate 120 is an AND gate, the second logic gate 120 may generate a timing reference signal 122 based on a valid signal 112 and a current state bit 128. As described above, since the current state bit 128 are already generated at the first memory element 125 when the valid signal 128 is reached at the second logic gate 120, a total time of generating the timing reference signal 122 may be the sum of processing delays at the comparator 105, the first logic gate 110, and the second logic gate 120.

It should be noted that the SAR ADC 100 may include multiple second logic gates 120 that are connected to multiple flip flops in the first memory element 125. For example, assuming that the SAR ADC 100 is an 8-bit ADC with 9 multiple flip flops (e.g., flip flops 0-9), the SAR ADC 100 may include 8 second logic gates 120 (e.g., second logic gates 1-8) that are coupled to each of the flip flops 1-8 respectively to receive corresponding current stat bits 128.

Similar to the first memory element 125, the second memory element 115 may comprise multiple flip flops to generate multiple next state bits 116. For example, the second memory element 115 may include flip flops S1-S3 to generate three next state bits 116. The second memory element 115 may be initialized by a synchronous sampling clock signal 103 (or synchronous sampling reference signal). Specifically, the flip flops S1-S3 in the second memory element 115 may be reset by the synchronous sampling clock signal 103. This means that outputs of the flip flops S1-S3 are initialized to a low state (i.e. logic 0). Similar to flip flops 0-8 in the first memory element 125, each of the multiple flip flops S1-S3 in the second memory element 115 may be any type of flip flops such as simple set-reset latches, gated latches, D flip flop, T flip flop, JK flip flop, or the like.

When a timing reference signal 122 changes from low to high (i.e. at the rising edge), the flip flops S1-S3 of the second memory element 115 may capture the values of comparator outputs 107. The captured values may become the Q outputs of the flip flops S1-S3, which are next state bits 116. It should be noted that the SAR ADC 100 may include multiple second memory elements 1-8 115 that are connected to multiple second logic gates 120. For example, assuming that the SAR ADC 100 is an 8-bit ADC, each of the second memory elements 1-8 115 are coupled to each of the second logic gates 1-8 120 respectively. This means that each flip flop in second memory elements 1-8 115 may be connected to each of the second logic gates 1-8 120 to generate next state bits 116.

Similar to the first and second logic gates 110, 120, a third logic gate 130 is a physical device implementing a Boolean function. For example, the third logic gate 120 may perform a logical operation based on a valid signal 112, a synchronous sampling clock signal 103, and a last bit of the current state bits 129, thereby producing a single binary output. This single binary output may be referred to as an asynchronous comparator clock signal 132. This asynchronous comparator clock signal 132 may control a precharge operation and an evaluation operation of the comparator 105. For example, when the asynchronous comparator clock signal 132 is low (i.e. logic 0), the comparator 105 may initiate the evaluation operation as described above. When the asynchronous comparator clock signal 132 is high (i.e. logic 1), the comparator 105 may initiate the precharge operation as described above.

The third logic gate 130 may be primarily implemented using diodes or transistors acting as electronic switches, but can also be constructed using vacuum tubes, electromagnetic relays (relay logic), fluidic logic, pneumatic logic, optics, molecules, or even mechanical elements. The third logic gate 130 may be any type of circuits configured to perform a logical function such as a NOT gate, an AND gate, an OR gate, a XOR gate, a NAND gate, a NOR gate, a XNOR gate, and the like.

The digital-to-analog converter (DAC) 135 is a device that converts a digital signal into an analog signal. The DAC 135 may include multiple capacitors and switches to generate a reference voltages 138 based on the next state bits 116. These reference voltages 138 may affect the analog input voltage of the input m 102 and input p 104, thereby increasing or decreasing the analog voltage of the input m 102 and input p 104 based on the reference voltages 138.

A critical path may be referred to as a bus or a transmission path on which signals are dropped off or picked up to generate a timing reference signal 122 and next state bits 116. For example, a critical path may connect the comparator 105, first logic gate 110, second logic gate 120, second memory element 115 and DAC 135 with each other. There may be various critical paths depending on topology of SAR ADCs. As described above, the current state bits 128 are already generated before the valid signal 112 is reached to the second logic gate 120, the timing reference signal 122 may be generated without a processing delay of the first memory element 125. This may result in a faster generation of next state bits 116 because it only includes a processing delay of one memory element (i.e. second memory element 115) and minor logic gate delays (i.e. first logic gate 110 and second logic gate 115).

Figure 2:
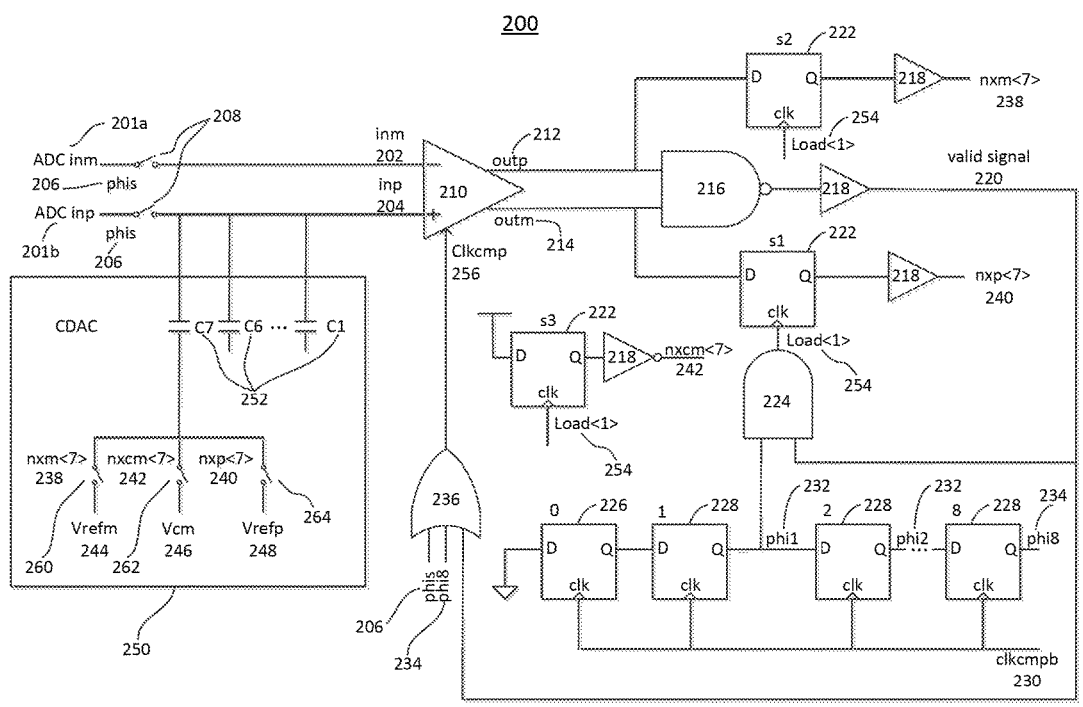
FIG. 2 is a circuit diagram illustrating an example SAR ADC for asynchronous clock generation.

FIG. 2 is a circuit diagram illustrating an example SAR ADC 200 for asynchronous clock generation. The SAR ADC 200 may comprise switches 208, a comparator 210, a NAND gate 216, buffer amplifiers 218, an AND gate 224, flip flops 0-8 226, 228, flip flops S1-S3 222, an OR gate 236, and a capacitor DAC (CDAC) 250.

The process of analog to digital conversion may be initiated after the analog input signals, ADC inm 201a and ADC inp 201b, are sampled by clock phis 206. For each analog to digital conversion, the clock phis 206 pulse may be sent from an external clock source. When the clock phis 206 is high (i.e. logic 1), the ADC inm 201a and ADC inp 201b may be connected to comparator input, inm 202 and inp 204. During this time (i.e. when the clock phis is high), the ADC inm 201a and ADC inp 201b are sampled at the inm 202 and inp 204. When the clock phis 206 is low (i.e logic 0), the ADC inm 201a and ADC inp 201b are disconnected from the inm 202 and inp 204. During this time (i.e. when the clock phis is low), the SAR ADC 200 may continue bit cycling process. After sampling the ADC inm 201a and ADC inp 201b, the inm 202 and inp 204 may become analog input voltages ranging from Vrefm 244 to Vrefp 248 volts as examples. The inm 202 and inp 204 may be initialized to a high state such as 1.0 volts. The phis 206 may be a synchronous sampling clock or a synchronous sampling reference signal that initializes clkcmp 256 and clkcmpb 230 signals. The phis 206 may also initialize all the flip flops 222, 226, 228. Specifically, when the switches 208 are connected and the phis 206 becomes a high state (i.e. logic 1), the phis 206 may initially set output of flip flop 0 226 (i.e. Q=1) and reset outputs of flip flops 1-8 (i.e. Qs=0). Moreover, the phis 206 may reset flip flops S1-S3 222 (i.e. Qs=0).

When the phis 206 is initially high (i.e. logic 1) and ADC input (i.e. ADC inm 201*a* and ADC inp 201*b*) is sampled at comparator input (i.e. inm 202 and inp 204), the clkcmp 256 signal may be initialized high (i.e. logic 1) because of the phis 206 signal in the OR gate 236. Specifically, with the high state of phis 206, the OR gate 236 results in the high state (logic 1) together with a phi8 234 and a valid signal 220. When the clkcmp 256 signal is high, the comparator 210 may be in a precharge state. This means that the comparator 210 may not determine which analog input voltage is larger among the inm 202 and inp 204. Thus, when the clkcmp 256 is high, both outp 212 and outm 214 result in high states (i.e. logic 1s). Since the outp 212 and outm 214 are both high, the valid signal 220 may become low (i.e. logic 0) after the outp 212 and outm 214 are processed at the NAND gate 216.

When the switches 208 are disconnected and the phis 208 falls to a low state (i.e. logic 0), the SAR ADC 200 may start a bit cycling of analog to digital conversion inside the SAR ADC loop. In other words, at the falling edge of phis 208, the comparator 210 may come out of the precharge state (reset) and enter into an evaluation phase. In FIG. 2, an example of 8 bit conversion is shown. When the phis 208 becomes low, the clkcmp 256 may go from high to low because the OR gate 236 results in a low state (because phis 208, phi8 234, and valid signal 220 are all low at this point). At this point, current state bits, phi1-phi8 232, 234, may be generated at the falling edge of the clkcmp 256 because the clkcmpb 230 is the inverse of the clkcmp 256 signal.

Specifically, when the clkcmp 256 goes into a falling edge (i.e. from high to low), the clkcmpb 230 goes into a rising edge (i.e. from low to high) and the flip flop 0 226 may capture the value of D input (i.e. 0). Since the output Q of the flip flop 0 226 was initially set by the phis 208 (i.e. Q=1), the flip flop 1 228 captures the value of input D (i.e. 1) at the rising edge of the clkcmpb 230. The captured value becomes the Q output (i.e. 1) of the flip flop 1 228. This output Q becomes the phi1 232 signal. At the rising edge of the clkcmpb 230, the flop flops 2-8 may generate phi2-phi8 232, 234 signals as described above. The phi1-phi8 232, 234 are the current state bits indicating the present bit that the SAR ADC is processing. These phi1-phi8 232, 234 signals may remain asserted up to the duration of the processing time of the current bit ADC processing, and then each of them are de-asserted. This example of generating the bit by bit state signal may be achieved by adding one extra flip flop (i.e. flip flop 0 226).

After the current state bits (i.e. phi1-phi8 232, 234) are generated by the flop flops 1-8 226, 228, the clkcmp signal 256 may change from low to high by phi8 234 at the OR gate 236. The comparator 210 may then enter in precharge phase and the SAR ADC 200 may be ready for next conversion. As described above, when the phis 208 becomes low, the clkcmp 256 may go from high to low. When the clkcmp 256 signal becomes low, the comparator 210 may be enabled and enter into an evaluation phase. This means that the comparator 210 may decide which analog input voltage is larger among the inm 202 and inp 204. After the determination of the comparator 210, one of outp 212 and outm 214 is always larger than the other output value. Since the outp 212 and outm 214 are different, the NAND gate 216 may generate the valid signal 220 that is high (i.e. logic 1). In an embodiment, a buffer amplifier (or buffer) 218 may be used before generating the valid signal 220 to prevent the signal source from being affected by whatever currents (or voltages, for a current buffer) that the load may produce.

With the valid signal 220 and the current state bits 232, an AND gate 224 may produce a timing reference signal. For example, the AND gate may perform a logical operation with the phi1-phi8 232, 234 and the valid signal 220, thereby producing the timing reference signal, load<1> 254. It should be noted that the current state bits (i.e. phi1-phi8 232, 234) are already generated before the valid signal 220 is reached to the AND gate 224. In this way, the critical path delay that involves processing flip flops 1-8 228 with the valid signal 220 may be reduced in generating the timing reference signal, load<1> 254. Although it is not shown in FIG. 2, there may be multiple AND gates 224 to generate multiple timing reference signals such as load<2> to load<8> based on the valid signal 220 and corresponding current state bits, phi2-phi8 232, 234.

As described above, a critical path may be referred to as a bus or a transmission path on which signals are dropped off or picked up at circuit devices in the SAR ADC 200 to generate a timing reference signal (e.g., load<1> 254) and next state bits (e.g., <7> 238, nxp<7> 240, and nxcm<7> 242). In FIG. 2, a bus connecting the comparator 210, NAND gate 216, buffer amplifier 218, AND gate 224, flip flops S1-S3 222, and CDAC 250 may be referred to as a critical path.

At flip flops S1-S3 222, the timing reference signal, load<1> 254, may be used to generate next state bits, nxm<7> 238, nxp<7> 240, and nxcm<7> 242. Specifically, when the load<1> 254 signal is in a rising edge (i.e. from low to high), the flip flops S1, S2 222 may capture the values of D inputs, which are the output of the comparator 210 (i.e. outm 214 and outp 212). The captured values may become the Q output of the flip flops S1, S2 222 which are essentially the next state bits (i.e. nxm<7> 238 and nxp<240> 240). Similarly, the flip flop S3 222 may also capture the value of D input (i.e. logic 1) at the rising edge of the load<1> 254 signal. The captured value may become the Q output of the flip flops S3 222, which is essentially the next state bit (i.e. nxcm<7> 242). In an embodiment, buffer amplifiers (or buffers) 218 may be used before generating the next state bits (i.e. nxm<7> 238, nxp<7> 240, and nxcm<7> 242) to prevent the signal source from being affected by whatever currents (or voltages, for a current buffer) that the load may produce. It should be noted that other next state bits such as nxm<6> to nxm<0>, nxp<6> to nxp<0>, and nxcm<6> to nxcm<0> may be generated at the corresponding rising edges of load signals such as load<2> to load<8> as described above.

As the current state bits, phi1-phi8 232, 234 are specific to the bit position that the SAR ADC 200 is processing, the timing reference signal, load<1> to load<8> 254, may have the same characteristics to the current state bits, phi1-phi8 232, 234. This means that the load <1> to load<8> signals may change from low to high as the phi1-phi8 signals change from low to high (i.e. specific to bit position). The load<1> 254 signal may be used to produce the next state bits (nxm<7> 238, nxp<7> 240, nxcm<7> 242) with one memory element (i.e. flip flops S1-S3 222), and removing all other memory element (i.e. flip flops 1-8 228) from a critical path to generate the load<1> 254 signal. In other words, because the current state bits, phi1-phi8 232, 234, are already generated when the valid signal 220 reached at the AND gate 224, the SAR ADC 200 may only use the flip flops S1-S3 222 to generate the next state bits, nxm<7> 238, nxp<7> 240, nxcm<7> 242. The SAR ADC 200 may not need to use the flip flops 0-8 226, 228 with the valid signal 220 to generate the current state bits, phi1-phi8 232, 234. Because the flip flops 0-8 226, 228 are not included in the critical path, the timing reference signal (i.e. load<1> 254) may be produced faster than a timing reference signal that may be produced by the flip flops 0-8 226 228 using the valid signal 220. Thus, a critical path delay that involves the processing time of flip flops 0-8 226 228 may be significantly reduced.

Accordingly, the timing equations that limits the critical path delay for generating next state bits 238, 240, 242 to only one memory element with minor logic gate delay may be expressed as follows:

$$T_{(next\ state)} = T_{comp(inp)} + T_{valid} + T_{flop} + T_{buffer} + T_{and} \quad \text{Equation (1)}$$

$$T_{bit} = T_{(next\ state)} + \max(T_{precharge}, T_{cdac}) \quad \text{Equation (2)}$$

$$T_{precharge} = T_{logic} + T_{compreset} \quad \text{Equation (3)}$$

In Equation (1), $T_{(next\ state)}$ is time to generate next state bits (e.g., nxm<7> 238, nxp<7> 240, nxcm<7> 242), $T_{comp(inp)}$ is time that a comparator 210 processes inputs (e.g., inm 202 and inp 204) and produces output (e.g., outp 212 and outm 214). $T_{valid}$ is time to generate a valid signal 220. $T_{flop}$ is time that flip flops S1-S3 process a timing reference signal (e.g., load<1> 254) and outputs of the comparator. $T_{buffer}$ is time that a buffer amplifier 218 process signals. $T_{and}$ is time that an AND gate 224 processes a valid signal 220 and a current state bits (e.g., phi1-phi8). In Equation (2), $T_{bit}$ is entire conversion time that one analog input is converted to digital output. $T_{precharge}$ is time when the comparator is in precharge operation. $T_{cdac}$ is time that CDAC 250 processes next state bits. In Equation (3), $T_{logic}$ is signal processing time at OR gate 236. $T_{compreset}$ is processing time that clkcmp signal 256 is reset at the comparator 210.

Next state bits (e.g., nxm<7> 238, nxp<7> 240, nxcm<7> 242) may be used to set a CDAC 250 so that sub multiple of reference voltage can be added or subtracted from a sampled input (e.g. inp 204) and a comparator 210 that is ready for the next bit conversion. The CDAC 250 may comprise multiple switches 260, 262, 264 connected to the next state bits (e.g., nxm<7> 238, nxp<7> 240, nxcm<7> 242), and multiple capacitors (e.g. C1-C8 252) to add or subtract the sub multiple of reference voltages (e.g. Vrefm 244, Vcm 246, Vrefp 248). The reference voltages may range from 0.0 to 0.25 volts. In one embodiment, Vcm 246 may be 0.125 volts, Vrefp 248 may be 0.25 volts, and Vrefm 244 may be 0.0 volts.

The switch 262 is initially connected because the nxcm<7> 242 is initially high (i.e. logic 1). Thus, the bottom plate of the C7 252 may be connected to the Vcm 246 and the top place of C7 252 may store a sampled input, inp 204. Once the comparator 210 initiates an evaluation operation and flip flops S1-S3 222 generates next state bits (nxm<7> 238, nxp<7> 240 and nxcm<7> 242), the switch 262 for nxcm<7> 242 is disconnected because the nxcm<7> 242 becomes a low state (logic 0). Simultaneously, one of next state bits (nxm<7> 238 and nxp<7> 240) becomes a high state (i.e. logic 1) and the other becomes a low state (i.e. logic 0). This means that one of switches 260, 264 is connected and the other is disconnected. For example, if nxm<7> 238 is high (i.e. logic 1) and nxp<7> is low (i.e. logic 0), the switch 260 is connected and the switch 264 is disconnected. Accordingly, the Vrefm 244 is connected to the bottom plate of C7. If a reference voltage is higher than Vcm 246, (i.e. Vrefp is selected by next state bits), the bottom plate of C7 252 stores electronic charges, thereby increasing voltage of the top plate of C7 252. This may add voltages of input signal inp 204. On the other hand, if a reference voltage is lower than Vcm 246 (i.e. Vrefm is selected by the next state bits), the bottom plate of C7 252 reduces electronic charges, thereby decreasing voltage of the top plate C7 252. This may subtract voltages of input signal inp 204. Thus, changes in the top plate of C7 252 may affect the comparator 210 in the next evaluation.

Figure 3:
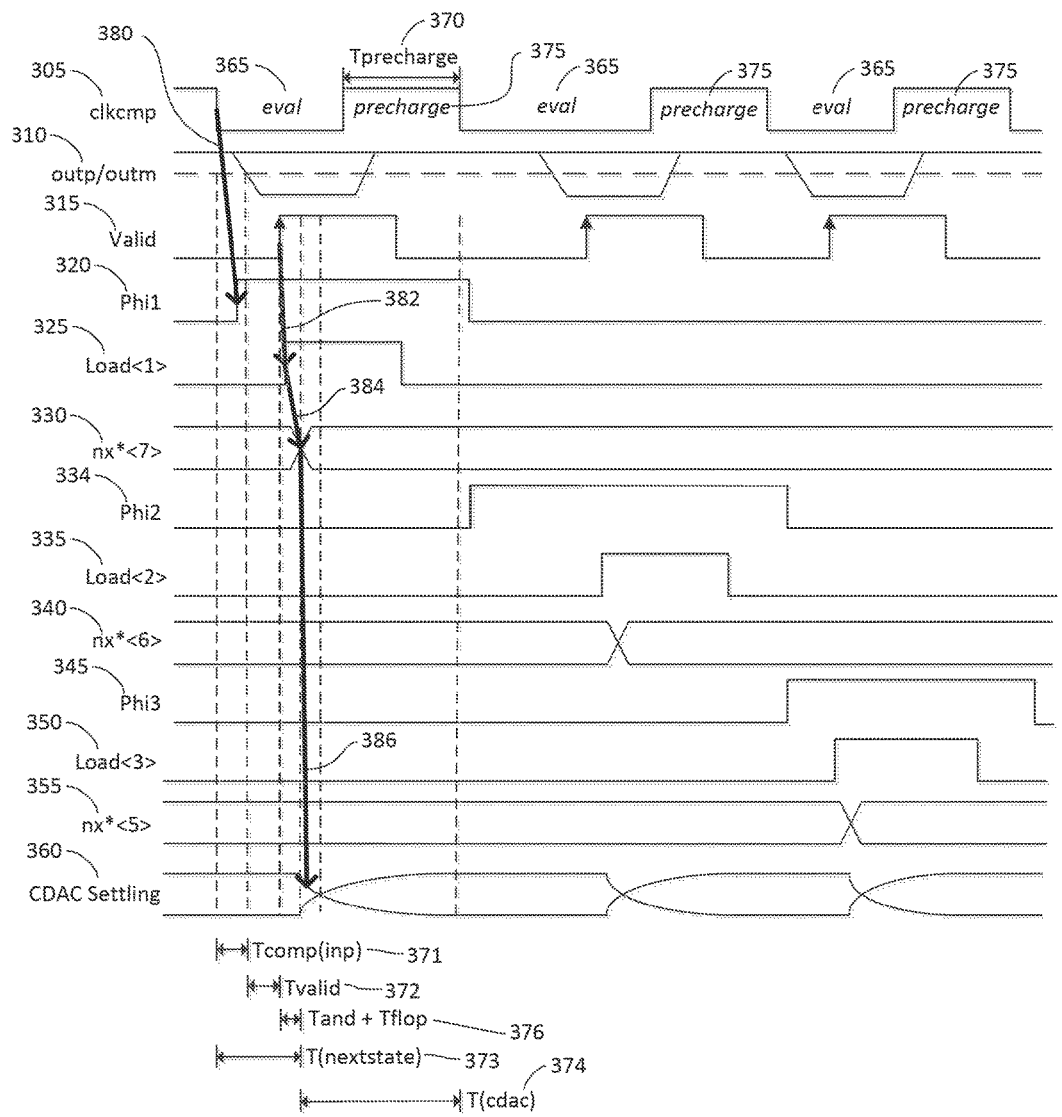
FIG. 3 is a timing diagram illustrating an example of asynchronous clock generation illustrated in FIG. 2.
Figure 4:
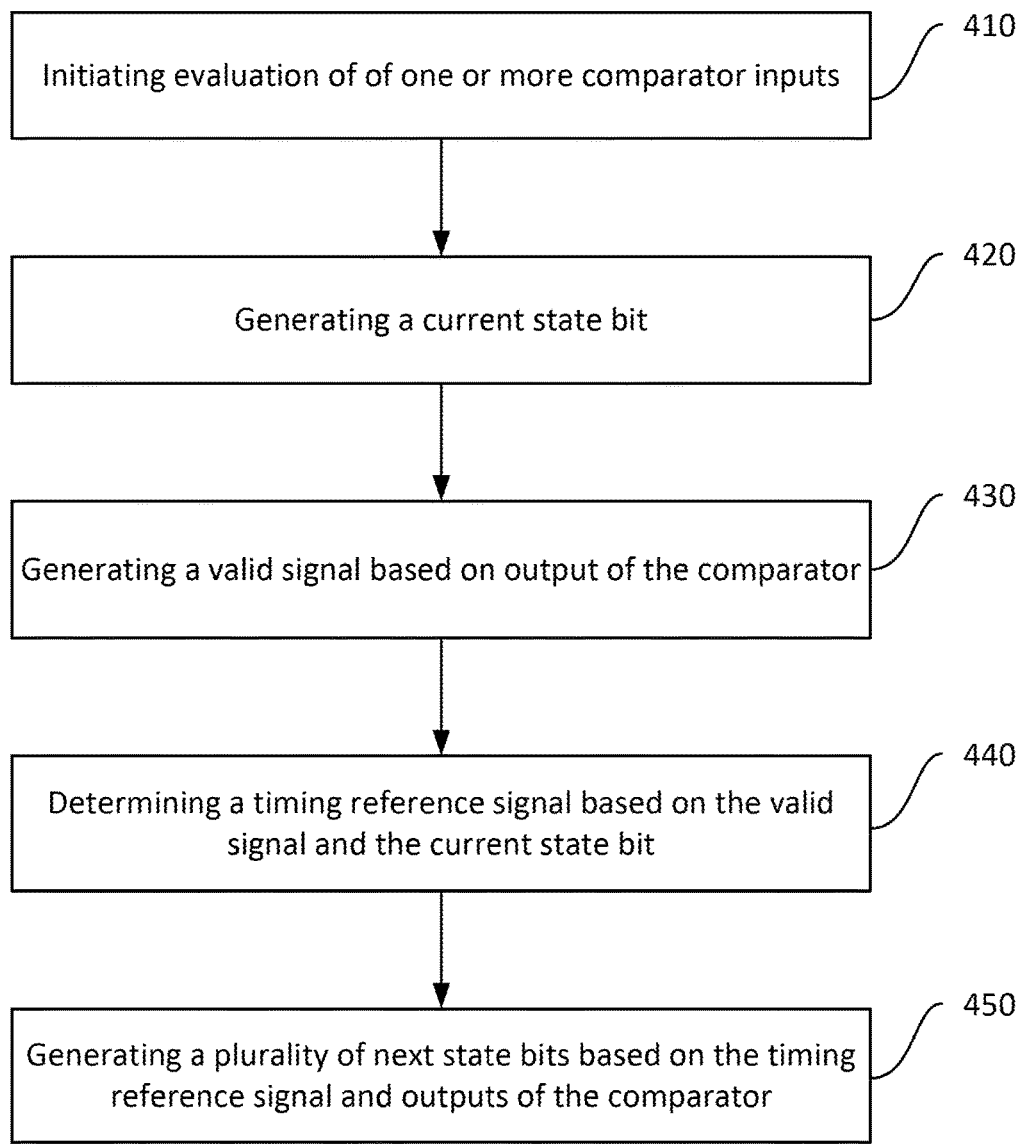
FIG. 4 is a diagram illustrating an example process for asynchronous clock generation.

FIG. 3 is a timing diagram illustrating asynchronous clock generation illustrated in FIG. 2. As described above, when a clkcmp 305 signal enters into a falling edge (i.e. from high to low) by a phis signal, a comparator may enter into an evaluation phase 365. Because a clkcmpb signal is the inverse signal of clkcmp 305, the clkcmpb signal may become a rising edge (i.e. from low to high) at the falling edge of clkcmp 305 signal. When the clkcmpb signal is in the rising edge, a flip flop 1 may capture the value of input (i.e. D=1) into the output (i.e. Q=1). This output of the flip flop 1 is a current state bit, phi1 320. Since the phi1 320 signal was initially low (i.e. logic 0), as shown in step 380, at the falling edge of the clkcmp 305 signal, the phi1 320 signal may enter into a high state (i.e. logic 1) after a processing delay of the flip flop 1. Moreover, at the falling edge of the clkcmp 305 signal, a comparator may initiate evaluation of analog input signals (e.g., inm 202 and inp 204) and generate outp and outm 310 after a processing delay of the comparator. This processing delay of the comparator may be referred to as a Tcomp(inp) 371. Thus, as shown in FIG. 4, the current state bit, phi1 320, is already high (i.e. logic 1) before the outp and outm 310 signals become high (i.e. logic 1).

Once the comparator evaluates which analog input signal is larger among the inm and inp, one of outp and outm 310 may necessarily be larger than the other output after the comparator processed the inm and inp. For example, if the outm is high (i.e. logic 1), the outm is low (i.e. logic 0) after the comparator. Since the outp and outm 310 are not the same, a NAND gate may process the outp and outm 310, thereby generating a valid signal 315 after the processing delay of the NAND gate. This processing delay of NAND gate may be referred to as a Tvalid 372. Thus, the sum of Tcomp(inp) 371 and Tvalid 372 may be a processing delay to generate the valid signal 315 after the comparator initiates its evaluation operation (i.e. evaluation phase 365) by the clkcmp 305 signal. It should be noted that the current stat bit, phi1 320, is already high (i.e. logic 1) before the valid signal 315 becomes high (i.e. logic 1).

After the valid signal 315 is generated (i.e. logic 1), an AND gate may generate a timing reference signal, load<1> 325. As shown in step 382, the load<1> 325 signal becomes high after a processing delay of the AND gate because the phi1 320 signal is already generated (i.e. logic 1). This processing delay of the AND gate may be referred to as a Tand 376. This timing reference signal, load<1> 352, may be used to generate next state bit, nx*<7> 330, after the processing delay of flip flops (e.g., flip flops S1, S2 222). The nx*<7> 330 may include nxm<7> and nxp<7>. The processing delay of the flip flops may be referred to as Tflops 376. For example, when the load<1> 325 signal enters into a rising edge (i.e. from low to high), the flip flops S1, S2 222 may capture outp and outm 310 of the comparator. These captured outp and outm 310 may be the next state bits, nx*<7> 330 (i.e. nxp<7> and nxm<7>). As shown in step 384, after the flip flop S1, S2 222, one of nx*<7> becomes high (i.e. logic 1) and the other becomes low (i.e. logic 0). For example, if the nxp<7> is logic 1, the nxm<7> is logic 0. As described in Equation (1) and FIG. 3, the processing delay T(nextstate) 373 to generate next state bits nx*<7> may be the sum of $T_{comp(inp)}$ 371, $T_{valid}$ 372, $T_{flop}$, $T_{and}$ 376 and $T_{buffer}$.

As shown in FIG. 3, since a current state bit, phi1 320, is already high (i.e. logic 1) when a valid signal 315 becomes high (i.e. logic 1), an AND gate may generate a timing reference signal load<1> 325 with a processing delay of the AND gate, Tand 376. Thus, next state bits, nx*<7> 330, may be generated after flip flops S1, S2 processed the outp and outm 310. This means that the SAR ADC may not need to use flip flops 0-8 226, 228 with a valid signal 315 to generate the current state bit phi1 320. Thus, the flip flops 0-8 226, 228 may not be included in the critical path. Thus, a critical path delay that involves the processing time of flip flops 0-8 may be significantly reduced.

As shown in step 386, after the next state bits nx*<7> are changed, CDAC settling may be initiated. For example, if nxm<7> changes from high to low and nxp<7> changes from low to high, a switch in CDAC that connects a vrefm to a bottom plate of the capacitor may be disconnected. Another switch that connects a vrefp to the bottom plate of the capacitor may be connected as the nxp<7> changes from low to high. Once the voltages of the bottom plate changes, it may change the voltages of the top plate. Since the top plate is connected to an analog input voltage of a comparator, the voltage changes in the top plate may affect the analog input voltage that enters the comparator. This process may be called a CDAC settling 360. The processing time for the CDAC settling 360 may be referred to as T(cdac) 374.

Once a comparator enters into an evaluation phase 365 and a valid signal 315 changes from low to high, the valid signal 315 may go from high to low after the valid signal 315 is processed in an OR gate 236 as an example. Specifically, when the valid signal 315 (i.e. logic 1) enters into the OR gate 236, both phis 206 and phi8 234 are low (i.e. logic 0). Thus, the output of the OR gate is high (i.e. logic 1), which is the state of clkcmp signal 305. When the clkcmp signal 305 changes from low to high, the comparator may enter into a precharge phase 375 until the clkcmp signal 305 changes from high to low again as shown in FIG. 3. The time when the comparator is in the precharge phase 375 may be referred to as a Tprecharge 370. During the precharge phase 375, the comparator does not evaluate analog inputs (e.g., inm 202 and inp 204). Thus, comparator outputs, outm and outp 310, become high (i.e. logic 1) again. Since the outm and outp are both high, a NAND gate that generates a valid signal 315 may change the valid signal 315 from high to low. This may result in changing the timing reference signal, load<1> 325, from high to low after the valid signal 315 is processed at an AND gate. However, the next state bits, nx*<7> 330, may not be changed because the load<1> 325 does not go into a rising edge again. The next state btis nx*<7> 330 may be the first bit (e.g., the most significant bit) from the analog to digital conversion.

After the valid signal 315 changes from high to low (i.e. logic 0), when it reaches the OR gate 236 again, the OR gate 236 may produce a logic 0 as its output. As described above, the output may be the clkcmp 305 signal. Since the clkcmp 305 signal changes from high to low again, the comparator may enter into a second evaluation phase 365 at the falling edge of the clkcmp 305 signal. Once the comparator initiates the evaluation operation, the signals (i.e. outp and outm 310, valid signal 315, phi2 334, load<2> 335, and nx*<6> 340) that resulted from the clkcmp signal 305 may be generated as described above. This loop may be performed until all of the 8 bits are converted.

As described above, once a comparator decides a first bit (e.g., the most significant bit), it may continue to decide next bits until all the 8 bits are converted. The first bit was determined by the clkcmp 305 signal when the clkcmp 305 signal changes from high to low. From that point, all the bit conversion is determined by timing reference signals such as load signals (e.g., load<1> 325 to load<8>). When each of the load signals is asserted into memory elements (e.g., flip flops S1, S2 222), the SAR ADC may generate each of the next state bits (e.g., nx*<7> to nx*(0)), thereby converting analog input signals to digital representation. This may be referred to as an asynchronous clock generation because the SAR ADC described herein does not use a timing reference signal from external sources such as external clocks. Instead, the SAR ADC uses internal timing reference signals (e.g., load<1> to load <8>) to generate next state bits (e.g. nx*<7> to nx*<0>), thereby achieving the asynchronous clock generation.

FIG. 4 is a diagram illustrating an example process for asynchronous clock generation. At step 410, an SAR ADC may initiate an evaluation operation of multiple comparator inputs when an asynchronous comparator clock signal enters into a falling edge (i.e. from high to low). The multiple comparator inputs may include analog input voltages received from a sample and hold (S/H) circuit. At the falling edge of the asynchronous comparator clock signal, the comparator may decide which analog input voltage is larger among them. After determining the larger input, the comparator may produce one or more comparator outputs. The comparator outputs may be a binary logic signal indicating a state of high or low (i.e. logic 1 or logic 0). At the rising edge of the asynchronous comparator clock signal, the SAR ADC may initiate a precharge operation. The precharge operation may mean that the comparator does not decide which analog input voltage is larger. The comparator may produce one or more outputs, for example a first output and a second output. However, unlike the falling edge, the status of the outputs at the rising edge of the asynchronous comparator clock signal may be the same. For example, the first and second outputs are both high (i.e. logic 1).

At step 420, a first memory element may generate a current state bit based on an inverse signal of the asynchronous comparator clock signal. The first memory element may include multiple flip flops such as D flip flops. Because the falling edge of the asynchronous comparator clock signal is the rising edge of the inverse signal, the first memory element (e.g., D flip flops) may capture its input at the falling edge of the asynchronous comparator clock signal. The captured input value may become the output of the first memory element, which is the current state bit.

After the current state bit is generated, at step 430, a first logic gate such as a NAND gate may generate a valid signal based on the comparator outputs. Specifically, at the falling edge of the asynchronous comparator clock signal, the comparator initiates an evaluation operation and produces the comparator outputs that are different each other. Once the comparator outputs are entered into the first logic gate, the logic gate (e.g. NAND gate) may determine the valid signal as high (i.e. logic 1) because the comparator outputs are different each other. However, at the rising edge of the asynchronous comparator clock signal, the comparator initiates a precharge operation and produces the comparator outputs that are the same each other. Once the comparator outputs are entered into the first logic gate, the logic gate (e.g. NAND gate) may determine the valid signal as low (i.e. logic 0) because the comparator outputs are the same each other.

It should be noted that the valid signal may be generated after processing delays at the comparator and the first logic gate. Thus, the current state bit may be generated earlier than the valid signal because the current state bit does not involve the processing delays at the comparator and the first logic gate.

At step 440, a second logic gate such as an AND gate may determine a timing reference signal based on the valid signal and the current state bit. For example, the second logic gate may perform a logical AND operation on the current state bit and a valid signal, thereby producing a single binary output. This single binary output may be the timing reference signal.

At step 450, a second memory element may generate a plurality of next state bits based on the timing reference signal and the comparator outputs. The second memory element may include multiple flip flops such as D flip flops. Specifically, at the rising edge of the timing reference signal, the second memory element (e.g. D flip flops) may capture the values of comparator outputs as inputs and produce the next state bits as outputs. These next state bits may be sent to a digital-to-analog converter (DAC) and may be used to generate reference voltages by the DAC. A third logic gate such as OR gate may generate the asynchronous comparator clock signal that controls the precharge and evaluation operation of the comparator. The asynchronous comparator clock signal may be determined based on the valid signal, a synchronous sampling clock signal, and a last bit of the current state bits.

It should be understood that many variations are possible based on the disclosure herein. Although features and elements are described above in particular combinations, each feature or element may be used alone without the other features and elements or in various combinations with or without other features and elements.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, metal-oxide semiconductor field-effect transistors (MOSFETs), ASICs, FPGAs circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor that implements aspects of the embodiments.

The suitable processors may include circuitry to implement the methods provided herein. The circuitry may include receiving circuitry, processing circuitry and transmitting circuitry.

The methods and flow charts provided herein may be implemented in a computer program, software, or firmware incorporated in a non-transitory computer-readable storage medium for execution by a general purpose computer or a processor. Examples of non-transitory computer-readable storage media, include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Further, the devices according to various embodiments described herein may be interspersed among other devices depending on the functionality of the microelectronic device. In addition, the number and components of the devices may vary depending on the functionality of the microelectronic device. By way of example, the number of correlators may vary from two to dozens.

What is claimed is:

1. An analog-to-digital converter (ADC) comprising:
    a comparator;
    a first logic gate, operatively coupled to the comparator, to generate a first output signal based on an output of the comparator;
    a second logic gate, operatively coupled to the first logic gate, to generate a second output signal indicative of timing reference of bit conversion;
    a first memory element, operatively coupled to the second logic gate, to generate a third output signal indicative of a current state of a bit that is input for the second logic gate;
    a second memory element, operatively coupled to the second logic gate, to generate a plurality of next state bits,
    wherein the second logic gate determines the second output signal based on the first output signal and the third output signal,
    a third logic gate, operatively coupled to the comparator and the first logic gate, to generate an asynchronous comparator clock signal that controls a precharge operation and an evaluation operation of the comparator; and
    a digital-to-analog converter (DAC), operatively coupled to the comparator and the second memory element, to generate a reference voltage based on the plurality of next state bits,
    wherein the third output signal is determined based on an inverse signal of the asynchronous comparator clock signal.

2. The ADC of claim 1, where each of the plurality of next state bits is determined based on the second output signal and the output of the comparator.

3. The ADC of claim 1, wherein the third output signal is generated earlier than the first output signal, wherein the first output signal indicates validity of output of the first logic gate.

4. The ADC of claim 1, wherein the asynchronous comparator clock signal is determined based on the first output signal, a synchronous sampling clock signal, and the third output signal.

5. The ADC of claim 1, wherein the comparator initiates the evaluation operation of one or more comparator inputs on a condition that the asynchronous comparator clock signal is low (logic 0) and the precharge operation on a condition that the asynchronous comparator clock signal is high (logic 1).

6. The ADC of claim 1, wherein the first output signal becomes high (logic 1) after a first processing delay at the comparator and a second processing delay at the first logic gate during the evaluation operation, and the first output signal becomes low (logic 0) after the first processing delay at the comparator and the second processing delay at the first logic gate during the precharge operation.

7. The ADC of claim 6, wherein the first processing delay at the comparator involves processing the one or more comparator inputs and the second processing delay at the first logic gate involves processing one or more outputs of the comparator.

8. The ADC of claim 1, wherein each of the first and second memory elements comprises a plurality of flip-flop circuits, and the first logic gate is a NAND gate and the second logic gate is an AND gate.

9. A method for asynchronous clock generation in an analog-to-digital converter (ADC), the method comprising:
generating, at a first logic gate operatively coupled to a comparator, a first output signal based on an output of the comparator;
generating, at a second logic gate operatively coupled to the first logic gate, a second output signal indicative of timing reference of bit conversion;
generating, at a first memory element operatively coupled to the second logic gate, a third output signal of a current state of a bit that is input for the second logic gate;
generating, at a second memory element operatively coupled to the second logic gate, a plurality of next state bits,
wherein the second output signal is determined by the second logic gate based on the first output signal and the third output signal,
generating, at a third logic gate operatively coupled to the comparator and the first logic gate, an asynchronous comparator clock signal that controls a precharge operation and an evaluation operation of the comparator; and
generating, at a digital-to-analog converter (DAC) operatively coupled to the comparator and the second memory element, a reference voltage based on the plurality of next state bits; and
determining the third output signal based on an inverse signal of the asynchronous comparator clock signal.

10. The method of claim 9, further comprising determining each of the plurality of next state bits based on the second output signal and the output of the comparator.

11. The method of claim 9, wherein the third output signal is generated earlier than the first output signal, wherein the first output signal indicates validity of output of the first logic gate.

12. The method of claim 9, further comprising determining the asynchronous comparator clock signal based on the first output signal, a synchronous sampling clock signal, and the third output signal.

13. The method of claim 9, further comprising:
initiating the evaluation operation of one or more comparator inputs on a condition that the asynchronous comparator clock signal is low (logic 0); and
initiating the precharge operation on a condition that the asynchronous comparator clock signal is high (logic 1).

14. The method of claim 9, further comprising:
determining the first output signal high (logic 1) after a first processing delay at the comparator and a second processing delay at the first logic gate during the evaluation operation; and
determining the first output signal low (logic 0) after the first processing delay at the comparator and the second processing delay at the first logic gate during the precharge operation.

15. The method of claim 14, wherein the first processing delay at the comparator involves processing the one or more comparator inputs and the second processing delay at the first logic gate involves processing one or more outputs of the comparator.

16. The method of claim 9, wherein each of the first and second memory elements comprises a plurality of flip-flop circuits, and the first logic gate is a NAND gate and the second logic gate is an AND gate.

* * * * *